(12) United States Patent  
Wada et al.

(10) Patent No.: US 6,827,633 B2  
(45) Date of Patent: Dec. 7, 2004

(54) POLISHING METHOD

(75) Inventors: Yutaka Wada, Tokyo (JP); Tomohiko Akatsuka, Tokyo (JP); Tatsuya Sasaki, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/330,189

(22) Filed: Dec. 30, 2002

(65) Prior Publication Data

US 2003/0124960 A1 Jul. 3, 2003

(30) Foreign Application Priority Data

Dec. 28, 2001 (JP) .......................................... 2001-401453

(51) Int. Cl.$^7$ .............................. B24B 1/00; B24B 7/00
(52) U.S. Cl. .............................. 451/41; 451/67; 451/57; 451/287
(58) Field of Search .............................. 451/41, 54, 57, 451/58, 65–67, 285–289; 15/77, 88.3, 102, 302; 438/691, 692; 510/175; 134/2, 902, 1.2, 1.3

(56) References Cited

U.S. PATENT DOCUMENTS

| | | | | |
|---|---|---|---|---|
| 6,155,910 A | * | 12/2000 | Lamphere et al. | 451/41 |
| 6,167,583 B1 | * | 1/2001 | Miyashita et al. | 15/77 |
| 6,193,588 B1 | * | 2/2001 | Carlson et al. | 451/66 |
| 6,332,835 B1 | * | 12/2001 | Nishimura et al. | 451/67 |
| 6,379,230 B1 | * | 4/2002 | Hayashi et al. | 451/292 |
| 6,406,358 B1 | * | 6/2002 | Barnhart et al. | 451/65 |
| 6,413,156 B1 | | 7/2002 | Shimizu et al. | |
| 6,444,583 B2 | * | 9/2002 | Aoki | 438/692 |
| 6,560,809 B1 | * | 5/2003 | Atoh | 15/88.3 |
| 6,638,144 B2 | * | 10/2003 | Sventek et al. | 451/41 |

* cited by examiner

Primary Examiner—Hadi Shakeri  
(74) Attorney, Agent, or Firm—Wenderoth, Lind & Ponack, L.L.P.

(57) ABSTRACT

A wafer is pressed against a fixed abrasive and brought into sliding contact with the fixed abrasive. Thus, the wafer is polished. A surface of the fixed abrasive is dressed so as to generate free abrasive particles thereon. A liquid or a gas, composed of a mixture of liquid or inert gas and pure water or chemical liquid, is ejected onto the surface of the fixed abrasive during or after the dressing process.

7 Claims, 5 Drawing Sheets

POLISHING METHOD

BACKGROUND OF THE INVENTION

1. Field of the Invention

The present invention relates to a polishing method, and more particularly to a polishing method of polishing a workpiece such as a semiconductor wafer with a fixed abrasive.

2. Description of the Related Art

As semiconductor devices become more highly integrated in recent years, circuit interconnections have become finer and distance between those circuit interconnections becomes smaller. In case of photolithography which can form interconnections that are at most 0.5 $\mu$m wide, it is required that surfaces on which pattern images are to be focused by a stepper should be as flat as possible because a depth of focus of an optical system is relatively small. A polishing apparatus for performing chemical mechanical polishing (CMP) has been used for planarizing a semiconductor wafer.

This type of chemical mechanical polishing (CMP) apparatus comprises a polishing table having a polishing pad attached thereon, and a top ring for holding a workpiece, to be polished, such as a semiconductor wafer. The workpiece is disposed between the polishing pad and the top ring and pressed against the polishing pad under a certain pressure by the top ring while the polishing table and the top ring are being rotated. The workpiece is polished to a flat mirror finish while a polishing liquid (slurry) is being supplied onto the polishing pad.

When the aforementioned chemical mechanical polishing process is continuously performed, polishing particles or polishing wastes are attached to the polishing pad, resulting in a change in properties of the polishing pad and a deterioration in polishing performance. Therefore, if an identical polishing pad is repeatedly used for polishing semiconductor wafers, problems such as lowered polishing rate and uneven polishing are caused. In order to overcome such problems, conditioning called dressing is performed before, after or during polishing of a semiconductor wafer to regenerate the polishing pad.

In a chemical mechanical polishing process using a polishing liquid as described above, a workpiece is polished while a polishing liquid containing a large amount of abrasive particles is being supplied onto a relatively soft polishing pad. Therefore, a problem of pattern dependence arises. Pattern dependence means that gentle irregularities are formed on a surface of a semiconductor wafer after a polishing process due to irregularities on the surface of the semiconductor wafer that existed before the polishing process, thus making it difficult to planarize the surface of the semiconductor wafer to a completely flat surface. Specifically, a polishing rate is higher in an area where irregularities have small pitches (a density of irregularities is large) and is lower in an area where irregularities have large pitches (a density of irregularities is small), and existence of areas of the higher polishing rate and areas of the lower polishing rate causes gentle irregularities to be formed on the surface of the semiconductor wafer. Further, during the polishing process using the polishing pad, since not only convexities but also concavities of the irregularities on the surface of semiconductor wafer are polished, it is difficult to stop the polishing process when the convexities of the irregularities are polished to a flat surface.

It has also been practiced to polish a semiconductor wafer with use of a fixed abrasive (grindstone) which comprises abrasive particles of cerium oxide ($CeO_2$) or the like fixed by a binder such as phenolic resin. A polishing process utilizing the fixed abrasive is advantageous in that polishing material, i.e., the fixed abrasive, is harder than a polishing pad used in a conventional CMP process, and tends to polish convexities of the irregularities more than concavities thereof, for thereby achieving a higher absolute level of planarity. Depending on composition of the fixed abrasive, the fixed abrasive provides a self-stop function which considerably lowers a polishing rate and practically stops a polishing process when the convexities of the irregularities are polished to a flat surface. The polishing process utilizing the fixed abrasive is also advantageous in that environmental load can be reduced because of no use of a suspension liquid (slurry) containing a large amount of abrasive particles.

However, when a dressing process is performed on the aforementioned fixed abrasive, massive particles (masses of polishing particles) tend to be produced on a surface of the fixed abrasive. The massive particles may enter a boundary between the semiconductor wafer and the fixed abrasive to cause scratches to be produced on a surface of the semiconductor wafer. After the semiconductor wafer is polished with the fixed abrasive, abrasive particles contained in the fixed abrasive are attached to the surface of the semiconductor wafer. Therefore, it is necessary to prevent the semiconductor wafer from being contaminated by the abrasive particles.

SUMMARY OF THE INVENTION

The present invention has been made in view of the above drawbacks. It is therefore an object of the present invention to provide a polishing method which can effectively remove massive abrasive particles produced on a surface of a fixed abrasive, by performing a dressing process, to prevent scratches from being produced on a surface of a workpiece, and can remove abrasive particles attached to a surface of a workpiece after a polishing process to prevent the workpiece from being contaminated.

According to a first aspect of the present invention, there is provided a method comprising: polishing a workpiece by pressing the workpiece against a fixed abrasive and bringing the workpiece into sliding contact with the fixed abrasive; dressing a surface of the fixed abrasive so as to generate free abrasive particles thereon; and ejecting (or atomizing) a liquid or a gas, composed of a mixture of liquid or inert gas and pure water or chemical liquid, onto the surface of the fixed abrasive during or after the dressing of the surface of the fixed abrasive.

As described above, when the dressing process is performed on the fixed abrasive, massive particles (masses of polishing particles) tend to be produced on the surface of the fixed abrasive. According to the present invention, atomization is performed on the surface of the fixed abrasive during the dressing process or immediately after the dressing process. Therefore, even if massive particles, which cause scratches on a surface of the wafer, are produced on the surface of the fixed abrasive by the dressing process, the atomization can remove the massive particles from the surface of the fixed abrasive to prevent the workpiece from being scratched.

It is free fine abrasive particles present on the surface of the fixed abrasive that contribute to a polishing process of the workpiece. These free fine abrasive particles are unlikely to be removed by atomization. Therefore, while massive particles are removed as described above, the free fine abrasive particles which contribute to a polishing rate are not removed, and the polishing rate is not affected by atomization. However, if pressure of an inert gas is higher than 0.5 MPa, then the fine abrasive particles are likely to be removed to thereby lower the polishing rate. Therefore, it is desirable that a flow rate of the liquid is within a range of from 200 to 5000 cm$^3$/min, and pressure of the inert gas is within a range of from 0.05 to 0.5 MPa. More preferably, the flow rate of the liquid is about 1000 cm$^3$/min, and the pressure of the inert gas is about 0.15 MPa.

Such atomization may be performed in either case of an in-situ dressing process in which a dressing process is performed during a polishing process of a workpiece, or an ex-situ dressing process in which a dressing process is performed when the workpiece is not polished. The atomization should preferably be performed during the dressing process. Particularly, in the case of the in-situ dressing process, it is necessary to perform the atomization during the dressing process.

The liquid should preferably be ejected toward an outer peripheral edge of the fixed abrasive. When the liquid is ejected toward the outer peripheral edge of the fixed abrasive, the aforementioned massive particles can efficiently be removed from the surface of the fixed abrasive. When gas is ejected onto the surface of the fixed abrasive for removing the massive particles, the liquid is supplied together with the gas onto the surface of the fixed abrasive. The gas is ejected onto the liquid supplied to the surface of the fixed abrasive to thereby promote removal of foreign matter from the surface of the fixed abrasive.

According to a second aspect of the present invention, there is provided a method comprising: polishing a workpiece by pressing the workpiece against a fixed abrasive and bringing the workpiece into sliding contact with the fixed abrasive while dressing a surface of the fixed abrasive; and continuously polishing the workpiece while not dressing the surface of the fixed abrasive.

From a viewpoint of wear resistance, the dressing process should preferably be performed with a dressing tool (diamond dresser) having particulates such as diamond particles electrodeposited thereon.

As described above, if massive particles are produced on the surface of the fixed abrasive by performance of the dressing process and enter the boundary between the workpiece and the fixed abrasive, then the massive particles are crushed to cause scratches to be produced on a surface of a workpiece. According to the present invention, the workpiece is polished while dressing a surface of the fixed abrasive, and then is polished while not dressing the surface of the fixed abrasive. Therefore, even if massive particles are produced on the surface of the fixed abrasive by performance of the dressing process, the massive particles are crushed or removed from the surface of the fixed abrasive during the polishing process, so that scratches are not newly produced on the surface of the workpiece. Specifically, although scratches may be produced on a surface of a workpiece during an initial stage of a polishing process, the scratches can gradually be shallowed by continuously polishing the workpiece and can finally be eliminated. Further, although scratches are continuously produced on a surface of a workpiece during an in-situ dressing process, these scratches can be eliminated by stopping the dressing process and continuing a polishing process.

In a dressing process before a polishing process, i.e., an ex-situ dressing process, when atomization is performed together with the above method, scratches can be prevented more effectively. It is desirable to supply pure water (DIW) during the dressing process, and ultra pure water or a chemical liquid containing no abrasive particles as a polishing liquid during the polishing process, onto the surface of the fixed abrasive.

If surface pressure during a dressing process is high, then the number of massive particles (masses of polishing particles) produced becomes large, and larger massive particles are likely to be produced. As a result, the number of scratches on the workpiece is increased, and depths of the scratches become greater. Since such massive particles hardly contribute to improvement of a polishing rate, it is desirable that the number of massive particles be small. Therefore, surface pressure during the dressing process should preferably be set to be as small as possible, 9.8 kPa or lower, for example. Further, it is desirable that surface pressure of the workpiece, when the workpiece is being polished while not dressing the surface of the fixed abrasive, be set to be smaller than that when the workpiece is being polished while dressing the surface of the fixed abrasive.

According to a third aspect of the present invention, there is provided a method comprising: polishing a workpiece by pressing the workpiece against a fixed abrasive and bringing the workpiece into sliding contact with the fixed abrasive; and then water-polishing the workpiece while supplying pure water to the fixed abrasive, wherein surface pressure of the workpiece during the water-polishing is set to be smaller than that during the polishing using the fixed abrasive.

During the water-polishing process, abrasive particles attached to the surface of the workpiece can be cleaned and removed from a surface of the workpiece. The water-polishing process should preferably be performed for 5 seconds or longer.

A rotational speed of the fixed abrasive (polishing table) during the polishing process is usually 30 revolutions per minute or smaller. The rotational speed of the polishing table should preferably be increased to 50 revolutions per minute or higher to enhance an effect of cleaning and removing abrasive particles attached to the surface of the workpiece.

When a fixed abrasive is used for polishing a workpiece, the workpiece may be polished even during a water-polishing process. In order to prevent such a drawback, it is necessary to reduce surface pressure of the workpiece as small as possible. Although surface pressure of the workpiece during the polishing process using the fixed abrasive is usually 29.4 kPa or higher, surface pressure of the workpiece during the water-polishing process should preferably be set to be smaller than that during the polishing process using the fixed abrasive. Specifically, the surface pressure of the workpiece during the water-polishing process should preferably be reduced to 29.4 kPa or lower, more preferably 20 kPa or lower.

Water-polishing should preferably comprise supplying pure water at a flow rate larger than a flow rate of a polishing liquid supplied during polishing using a fixed abrasive.

When a workpiece is separated or removed from a surface of the fixed abrasive, a portion of the workpiece is exposed beyond an outer peripheral edge of the fixed abrasive so as not to leave the wafer on the surface of the fixed abrasive, which is called an overhanging process. However, if rotational speed of the polishing table is high, then the workpiece cannot stably be held at a overhanging position by a top ring so as to cause scratches or unevenly polished portions to be produced on the workpiece by the outer peripheral edge of the fixed abrasive. Therefore, when the workpiece is lifted from the fixed abrasive (polishing table) during the overhanging process, rotational speed of the polishing table should preferably be reduced to 10 revolutions per minute or lower. The workpiece should preferably be removed directly from the surface of the fixed abrasive without the overhanging process, in which a portion of the workpiece is exposed beyond the outer peripheral edge of the fixed abrasive.

According to a fourth aspect of the present invention, there is provided a method comprising: polishing a workpiece by pressing the workpiece against a fixed abrasive and bringing the workpiece into sliding contact with the fixed abrasive; and then cleaning (or buff cleaning) the workpiece by pressing the workpiece against a soft cleaning surface and supplying a liquid containing no abrasive particles to the cleaning surface.

When the workpiece is polished with the fixed abrasive, abrasive particles contained in the fixed abrasive are likely to be attached to a surface of the workpiece immediately after the polishing process. Particularly, abrasive particles of ceria are easily attached to a surface of a silicon oxide film. According to the present invention, after the polishing process, the workpiece is pressed against a soft cleaning surface, and a liquid containing no abrasive particles is supplied to the cleaning surface. With a cleaning process, the abrasive particles attached to the surface of the workpiece can be removed from the surface of the workpiece. Soft surface means a surface having a large modulus of compression elasticity.

In this case, pure water may be supplied to the cleaning surface. It is more effective to supply an alkali liquid, preferably an alkali liquid having a pH of 9 or larger because surface potential (zeta potential) of ceria and an oxide film becomes negative in an alkali region, and the ceria and the oxide film become likely to become dissociated from each other by repulsion. When the alkali liquid contains tetramethylammonium hydroxide (TMAH), the ceria and the oxide film are more likely to become dissociated from each other, so that an effect of removing the abrasive particles can be enhanced.

According to a fifth aspect of the present invention, there is provided a method comprising: polishing a workpiece by pressing the workpiece against a fixed abrasive and bringing the workpiece into sliding contact with the fixed abrasive; and cleaning (or DHF cleaning) a surface of the workpiece with dilute hydrogen fluoride after the polishing of the workpiece.

When the workpiece is polished with the fixed abrasive, abrasive particles contained in the fixed abrasive are likely to be attached to a surface of the workpiece after the polishing process. In order to remove the abrasive particles attached to the surface of the workpiece, a DHF cleaning process may be performed instead of a buff cleaning process. When dilute hydrogen fluoride is added to a surface of a silicon oxide film, the oxide film is slightly dissolved. For example, when a DHF liquid of 0.5% is added to the surface of the silicon oxide film for about 30 seconds, the oxide film is dissolved by a thickness of about 50 Å. Thus, the oxide film is dissolved and removed together with abrasive particles attached to the surface of the oxide film. In this case, it is desirable to use a DHF liquid having a concentration of 0.1% or higher.

When scrubbing of a workpiece by a roll sponge, a pencil-type sponge, or a brush is accompanied with this DHF cleaning, the abrasive particles can be removed more effectively. It is desirable to perform the DHF cleaning process immediately after the polishing process of the workpiece. However, the DHF cleaning process may be performed on a workpiece which has already been dried.

In a polishing method of pressing a workpiece against a polishing surface and bringing the workpiece into sliding contact with the polishing surface to polish the workpiece, a polishing liquid containing abrasive particles may be supplied to the polishing surface after the polishing process of the workpiece to perform a final polishing. In this case, the polishing surface may comprise a fixed abrasive or a polishing pad other than the fixed abrasive (for example, IC1000 or POLITEX made by Rodel Corp).

According to a sixth aspect of the present invention, there is provided a method comprising: polishing a workpiece by pressing the workpiece against a first polishing tool having a diameter and bringing the workpiece into sliding contact with the first polishing tool, while supplying a chemical liquid containing no abrasive particles to the first polishing tool; and further polishing the workpiece by subjecting the workpiece to a second polishing tool having a diameter larger than the diameter of the first polishing tool while supplying a polishing liquid containing abrasive particles to the second polishing tool.

According to a seventh aspect of the present invention, there is provided a method comprising: polishing a workpiece with a fixed abrasive while supplying a chemical liquid to a surface of the fixed abrasive; and simultaneously ejecting at least one of a liquid containing the chemical liquid, and a fluid composed of a mixture of inert gas and the chemical liquid, onto the surface of the fixed abrasive. In this case, the chemical liquid should preferably comprise an anionic surface-active agent. The workpiece should preferably comprise a semiconductor wafer on which a pattern of STI is formed.

According to an eighth aspect of the present invention, there is provided a polishing apparatus comprising: a holding device for holding a workpiece; a polishing table having a fixed abrasive thereon, the fixed abrasive including abrasive particles and a binder; a dressing device for generating free abrasive particles from the fixed abrasive; an ejection nozzle for ejecting a fluid onto a surface of the fixed abrasive to remove massive particles, which adversely affect a polishing process, from the surface of the fixed abrasive; a controller for adjusting a relative speed between the polishing table and the holding device; and a controller for adjusting a pressing force produced between the polishing table and the holding device.

The above and other objects, features, and advantages of the present invention will be apparent from the following description when taken in conjunction with the accompanying drawings which illustrate preferred embodiments of the present invention by way of example.

DETAILED DESCRIPTION OF THE PREFERRED EMBODIMENTS

Figure 1:
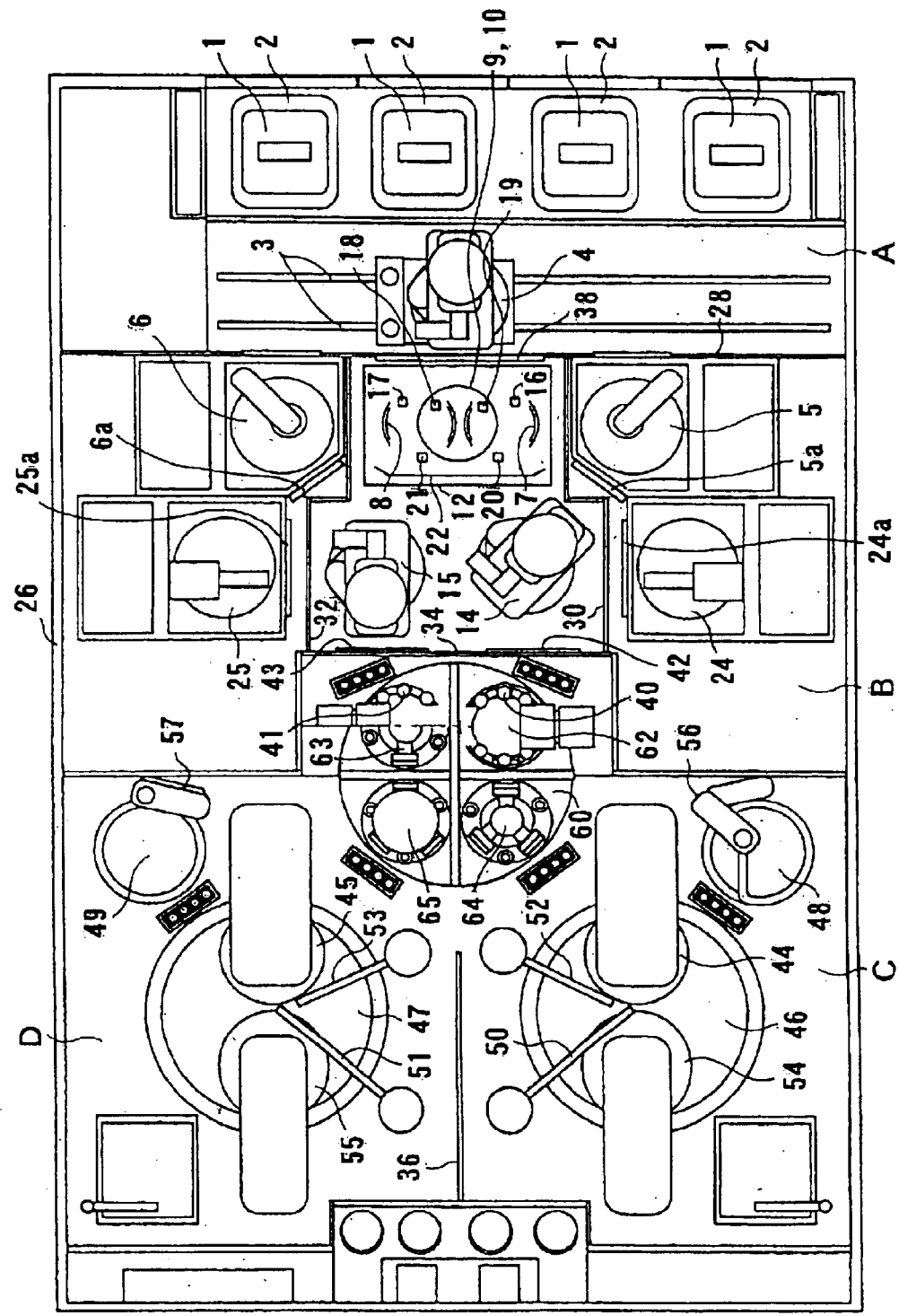
FIG. 1 is a plan view showing an entire arrangement of a polishing apparatus according to an embodiment of the present invention.

A polishing apparatus according to embodiments of the present invention will be described below with reference to the drawings. FIG. 1 is a plan view showing a whole arrangement of a polishing apparatus according to an embodiment of the present invention.

As shown in FIG. 1, the polishing apparatus comprises four load/unload stages 2 each for receiving a wafer cassette 1 which accommodates a plurality of workpieces such as semiconductor wafers. Each of the load/unload stages 2 may have a mechanism for lifting and lowering the wafer cassette 1. The polishing apparatus has a transfer robot 4 provided on rails 3 so that the transfer robot 4 can move along the rails 3 to access respective wafer cassettes 1 at respective load/unload stages 2.

The transfer robot 4 has upper and lower hands. The lower hand of the transfer robot 4 is a vacuum attraction-type hand for holding a semiconductor wafer under vacuum, and used only for removing a wafer from a wafer cassette 1. The vacuum attraction-type hand can hold and transport the semiconductor wafer even if the semiconductor wafer is not located at a normal position in the wafer cassette due to a slight displacement. The upper hand of the transfer robot 4 is a recess support-type hand for supporting a peripheral edge of a semiconductor wafer via a recess formed in the hand, and used only for returning the wafer to the wafer cassette 1. The recess support-type hand can transport the semiconductor wafer while keeping the semiconductor wafer clean because dust is not collected, unlike the vacuum attraction-type hand. In this manner, since a clean semiconductor wafer which has been cleaned is held by the upper hand, the clean semiconductor wafer is not further contaminated.

The polishing apparatus has two cleaning units 5, 6 disposed at an opposite side of the load/unload stages 2 with respect to the rails 3 of the transfer robot 4. These cleaning units 5, 6 are used for cleaning a semiconductor wafer. The cleaning units 5, 6 are disposed at positions accessible by the hands of the transfer robot 4. Each of the cleaning units 5, 6 has a spin-dry mechanism for drying a wafer by spinning the wafer at a high speed, and hence two-stage cleaning and three-stage cleaning of a wafer can be performed without replacing any cleaning modules.

Between the two cleaning units 5 and 6, a wafer station 12 having four wafer supports 7, 8, 9 and 10 is disposed at a position accessible by the transfer robot 4. A transfer robot 14 having two hands is disposed at a position where hands of the transfer robot 14 can access the cleaning unit 5 and the three wafer supports 7, 9 and 10. A transfer robot 15 having two hands is disposed at a position where hands of the transfer robot 15 can access the cleaning unit 6 and the three wafer supports 8, 9 and 10.

The wafer support 7 is used to transfer a wafer between the transfer robot 4 and the transfer robot 14 and has a sensor 16 for detecting existence of a wafer. The wafer support 8 is used to transfer a wafer between the transfer robot 4 and the transfer robot 15 and has a sensor 17 for detecting existence of a wafer.

The wafer support 9 is used to transfer a wafer from the transfer robot 15 to the transfer robot 14, and has a sensor 18 for detecting existence of a wafer and a rinsing nozzle 20 for supplying a rinsing liquid to the wafer to prevent the wafer from being dried or to rinse the wafer. The wafer support 10 is used to transfer a wafer from the transfer robot 14 to the transfer robot 15, and has a sensor 19 for detecting existence of a wafer and a rinsing nozzle 21 for supplying a rinsing liquid to the wafer to prevent the wafer from being dried or to rinse the wafer.

The wafer supports 9 and 10 are disposed in a common water-scatter-prevention cover which has an opening defined therein for transferring wafers therethrough. The opening can be opened and closed by a shutter 22. The wafer support 9 is disposed above the wafer support 10. Upper wafer support 9 serves to support a wafer which has been cleaned, and lower wafer support 10 serves to support a wafer to be cleaned, so that the cleaned wafer is prevented from being contaminated by rinsing liquid which would otherwise fall thereon. The sensors 16, 17, 18 and 19, the rinsing nozzles 20, 21, and the shutter 22 are schematically shown in FIG. 1, and their positions and shapes are not exactly illustrated.

A cleaning unit 24 is disposed at a position adjacent to the cleaning unit 5 and is accessible by the hands of the transfer robot 14, and another cleaning unit 25 is disposed at a position adjacent to the cleaning unit 6 and is accessible by hands of the transfer robot 15. Each of the cleaning units 24 and 25 is capable of cleaning both surfaces of a wafer.

Figure 3:
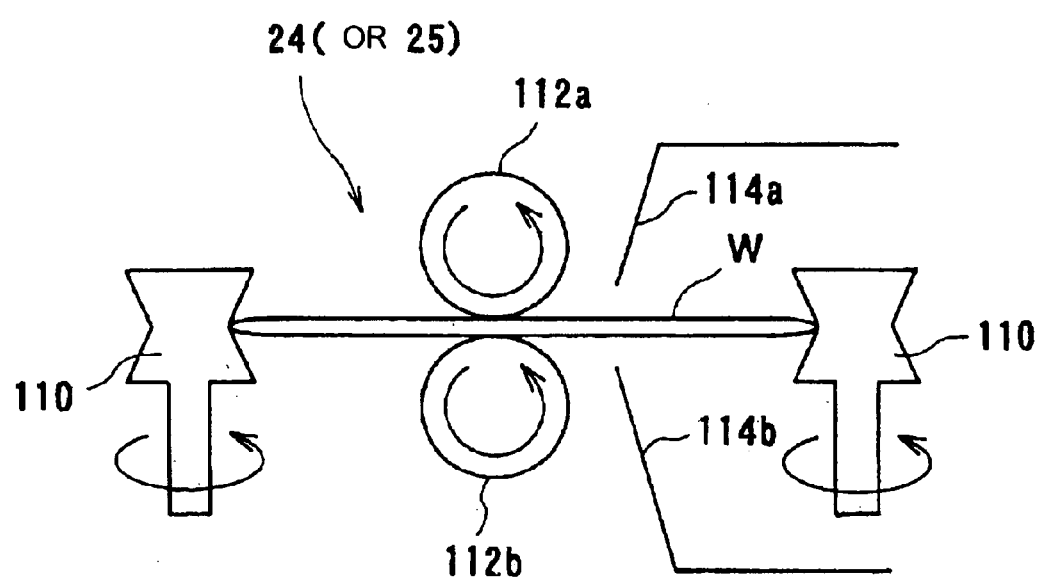
FIG. 3 is a schematic side view showing a cleaning unit of the polishing apparatus shown in FIG. 1.

FIG. 3 is a schematic side view showing the cleaning unit 24 or 25. As shown in FIG. 3, the cleaning unit 24 or 25 comprises a plurality of rollers 110 for rotating a semiconductor wafer W in a horizontal plane while holding a peripheral portion of the wafer W, an upper polyvinyl alcohol (PVA) sponge 112a for scrubbing an upper surface of the wafer W in a state such that the PVA sponge 112a is brought into contact with the upper surface of the wafer W, a lower PVA sponge 112b for scrubbing a lower surface of the wafer W in a state such that the PVA sponge 112b is brought into contact with the lower surface of the wafer W, a upper dilute hydrogen fluoride (DHF) supply nozzle 114a disposed above the wafer W, and a lower DHF supply nozzle 114b disposed below the wafer W. The DHF supply nozzles 114a, 114b supply dilute hydrogen fluoride (DHF) to the wafer W, respectively. Instead of DHF, ozone water or electrolytic ion water may be supplied to the wafer W. Since ozone water and electrolytic ion water do not require specific equipment, they can easily be used in the cleaning unit.

The transfer robot 14 and the transfer robot 15 have respective two hands which are located in a vertically spaced relationship. The respective upper hands of the transfer robot 14 and the transfer robot 15 are used for transporting a semiconductor wafer that has been cleaned to the cleaning units or the wafer supports of the wafer station 12. The respective lower hands of the transfer robot 14 and the transfer robot 15 are used for transporting a semiconductor wafer that has not cleaned or a semiconductor wafer to be polished. Since the lower hands are used to transfer a wafer to or from a reversing device, the upper hands are not contaminated by drops of rinsing liquid which fall from an upper wall of the reversing device.

As shown in FIG. 1, the cleaning units 5, 6, 24 and 25 have shutters 5a, 6a, 24a and 25a for transferring wafers therethrough, respectively. The shutters 5a, 6a, 24a and 25a are opened only when wafers are transferred through the shutters 5a, 6a, 24a and 25a.

The polishing apparatus has a housing 26 for enclosing various components therein. An interior of the housing 26 is partitioned into a plurality of compartments or sections (including areas A and B) by partition walls 28, 30, 32, 34 and 36.

Area A in which the load/unload stages 2 and the transfer robot 4 are disposed, and area B in which the cleaning units 5 and 6 and the wafer supports 7, 8, 9 and 10 are disposed, are partitioned by the partition wall 28 so that cleanliness of area A and area B can be separated from each other. The partition wall 28 has an opening for allowing semiconductor wafers to pass therethrough, and a shutter 38 is provided at the opening of the partition wall 28. All of the cleaning units 5, 6, 24 and 25, the wafer supports 7, 8, 9 and 10 of the wafer station 12, and the transfer robots 14 and 15 are placed in area B. Pressure in area B is adjusted so as to be lower than pressure in area A.

As shown in FIG. 1, in area C separated from area B by the partition wall 34, a reversing device 40 for reversing a semiconductor wafer is provided at a position accessible by the hands of the transfer robot 14. The semiconductor wafer is transferred to the reversing device 40 by the transfer robot 14. Further, in area C, a reversing device 41 for reversing a semiconductor wafer is provided at a position accessible by the hands of the transfer robot 15. The semiconductor wafer is transferred to the reversing device 41 by the transfer robot 15. Each of the reversing devices 40 and 41 has a chuck mechanism for chucking a semiconductor wafer, a reversing mechanism for reversing the semiconductor wafer, and a wafer detecting sensor for detecting whether or not the chuck mechanism chucks the semiconductor wafer.

The partition wall 34 forms a polishing section which is separated from area B. The polishing section is further divided into two areas C and D by the partition wall 36. The partition wall 34 between area B and areas C, D has two openings each for allowing semiconductor wafers to pass therethrough, one of which openings is used for transferring a wafer W to or from the reversing device 40 and the other of which openings is used for transferring a wafer to or from the reversing device 41. Shutters 42, 43 are respectively provided at the openings of the partition wall 34.

As shown in FIG. 1, each of areas C and D has two polishing tables and one top ring (holding device) for holding and pressing one semiconductor wafer against the polishing tables to polish the wafer. Specifically, area C has a top ring 44, a polishing table 46 having a large diameter, a polishing table 48 having a small diameter, a polishing liquid supply nozzle 50 for supplying a polishing liquid onto the polishing table 46, an atomizer 52 having a plurality of ejection nozzles (not shown) connected to a nitrogen gas supply source and a liquid supply source, a dresser 54 for dressing the polishing table 46, and a dresser 56 for dressing the polishing table 48. The diameter of the polishing surface of the large-diameter polishing table 46 is not less than twice the diameter of the semiconductor wafer. The diameter of the polishing surface of the small-diameter polishing table 48 is larger than the diameter of the semiconductor wafer, and is smaller than twice the diameter of the semiconductor wafer. Similarly, area D has a top ring 45, a polishing table 47 having a large diameter, a polishing table 49 having a small diameter, a polishing liquid supply nozzle 51 for supplying a polishing liquid onto the polishing table 47, an atomizer 53 having a plurality of ejection nozzles (not shown) connected to a nitrogen gas supply source and a liquid supply source, a dresser 55 for dressing the polishing table 47, and a dresser 57 for dressing the polishing table 49.

The polishing liquid supply nozzles 50, 51 supply polishing liquids, used for a polishing process, and dressing liquids (e.g., water) used for a dressing process, onto the polishing tables 46, 47, respectively. The atomizers 52, 53 eject liquids composed of a mixture of nitrogen gas with pure water or a chemical liquid onto the polishing tables 46, 47, respectively. Nitrogen gas from the nitrogen gas supply source and pure water or a chemical liquid from the liquid supply source are passed through a regulator or air operated valve (not shown) to regulate pressure thereof to a predetermined value, and supplied to the ejection nozzles in the atomizers 52, 53 in a mixed state. The chemical liquid may comprise a surface-active agent, for example. In this case, the liquid should preferably be ejected from the ejection nozzles of the atomizers 52, 53 toward outer peripheral edges of the polishing tables 46, 47. Other inert gases may be used instead of nitrogen gas. Further, the atomizers 52, 53 may eject only a liquid of pure water or a chemical liquid. The polishing tables 48, 49 may have atomizers as with the polishing tables 46, 47, respectively. With atomizers for the polishing tables 48, 49, surfaces of the polishing tables 48, 49 can be kept clean.

The mixture of nitrogen gas with pure water or the chemical liquid is supplied in a state of (1) liquid fine particles, (2) solid fine particles as a result of solidification of the liquid, or (3) gas as a result of vaporization of the liquid. These states (1), (2) and (3) are referred to as atomization. In these states, the mixture is ejected from the ejection nozzles of the atomizers 52, 53 toward the polishing tables 46, 47. For example, pressure or temperature of the nitrogen gas and/or the pure water or the chemical liquid, or the shape of the nozzles determines which state of the mixed liquid is to be ejected, i.e., the liquid fine particles, the solid fine particles, or gas. Therefore, the state of the liquid to be ejected can be varied, for example, by properly adjusting pressure or temperature of the nitrogen gas and/or the pure water or the chemical liquid with use of a regulator or the like, or by properly adjusting the shape of the nozzles.

The polishing tables 48, 49 may be replaced with wet-type thickness measuring devices for measuring a thickness of a film formed on a wafer. With such wet-type thickness measuring devices, the thickness of a film formed on a wafer can be measured immediately after the wafer is polished, and hence it is possible to further polish the polished wafer or to control a polishing process for polishing a subsequent wafer based on measured results.

Figure 2:
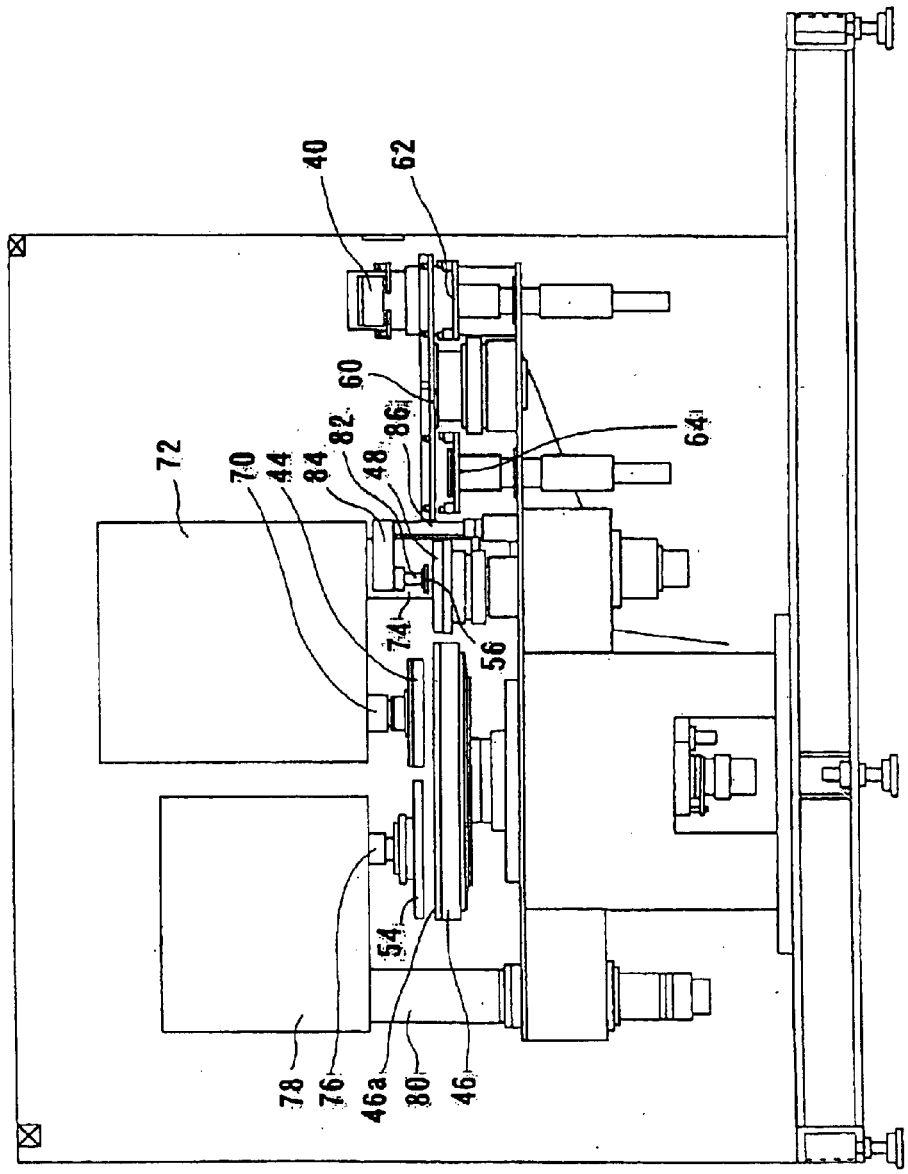
FIG. 2 is a front view of a polishing section of the polishing apparatus shown in FIG. 1.

As shown in FIGS. 1 and 2, a rotary transporter 60 is disposed below the reversing devices 40, 41 and the top ring 44 (in area C) and the top ring 45 (in area D). The rotary transporter 60 serves to transfer wafers between the cleaning section (area B) and the polishing section (areas C, D). The rotary transporter 60 has four stages for placing wafers W at equal angular intervals, and can hold a plurality of wafers thereon at the same time.

A wafer which has been transferred to the reversing device 40 or 41 is transferred to a lifter 62 or 63 disposed below the rotary transporter 60 by elevating the lifter 62 or 63 when a center of a stage of the rotary transporter 60 is aligned with a center of the wafer held by the reversing device 40 or 41. A wafer which has been transferred to the lifter 62 or 63 is transferred to the rotary transporter 60 by lowering the lifter 62 or 63. A wafer placed on the stage of the rotary transporter 60 is transported to a position below the top ring 44 (in area C) or the top ring 45 (in area D) by rotating the rotary transporter 60 by an angle of 90°. At this time, the top ring 44 (in area C) or the top ring 45 (in area D) is positioned above the rotary transporter 60 beforehand by a swinging motion of these top rings. A wafer held on the stage of the rotary transporter 60 is transferred to the top ring 44 or 45 by elevating a pusher 64 or 65 disposed below the rotary transporter 60 when a center of the top ring 44 or 45 is aligned with a center of the wafer.

Next, the polishing section (areas C, D) will be described below. Although only area C will be described below, the following description can be applied to area D. FIG. 2 shows a relationship between the top ring 44 and the polishing tables 46, 48 in area C.

As shown in FIG. 2, the top ring 44 is supported from a top ring head 72 by a top ring drive shaft 70 which is rotatable. The top ring head 72 is supported by a support shaft 74 which can angularly be positioned, and the top ring 44 can access the polishing tables 46 and 48. The dresser 54 is supported from a dresser head 78 by a dresser drive shaft 76 which is rotatable. The dresser head 78 is supported by a support shaft 80 which can angularly be positioned, and the dresser 54 can be moved between a standby position and a dressing position above the polishing table 46. The dresser 56 is similarly supported from a dresser head 84 by a dresser drive shaft 82 which is rotatable. The dresser head 84 is supported by a support shaft 86 which can angularly be positioned, and the dresser 56 can be moved between a standby position and a dressing position above the polishing table 48. The dressers 54, 56 comprise diamond dressers having diamond particles electrodeposited thereon, respectively, for example.

The large-diameter polishing table 46 has an upper surface composed of a fixed abrasive 46a having abrasive particles and pores or a pore agent, which are fixed by a binder (resin). The upper surface of the fixed abrasive 46a serves as a polishing surface for polishing a semiconductor wafer held by the top ring 44. Methyl-methacrylate-butadiene-styrene (MBS) resin is used as a binder. MBS resin is a copolymer base on materials of methyl-methacrylate, butadiene, and styrene, and has generally been used as a modifier for modifying shock resistance of vinyl chloride resin or acrylic resin. MBS is a core-shell type thermoplastic resin having a core of a rubber layer composed of a copolymer (SBR) containing butadiene and styrene, and a shell of a copolymer (MS) containing methyl-methacrylate and styrene. MBS resin may have a core of polybutadiene group rubber or polyacrylic ester group rubber, instead of the core of the copolymer (SBR) of butadiene and styrene. Further, the binder may comprise a resin in which an elastomer such as EPR, butadiene rubber, or ethylene-propylene rubber is dispersed, or a core-shell type resin having a core of an elastomer.

The small-diameter polishing table 48 has an upper surface composed of a soft nonwoven fabric. The upper surface of the nonwoven fabric serves as a cleaning surface for cleaning a semiconductor wafer after a polishing process to remove abrasive particles attached to a surface of the wafer.

Next, a polishing process for polishing a semiconductor wafer with the use of a polishing apparatus according to the present invention will be described below. Although a polishing process only in area C will be described below, the following description can be applied to a polishing process in area D.

First, a polishing process for polishing a semiconductor wafer on which a pattern of interlayer dielectrics (ILD) is formed will be described below. For example, the following dressing process (ex-situ dressing process) is performed in a case of polishing a wafer which is likely to be carved and is polished at a high polishing rate.

1) Ex-situ Dressing Process

The polishing table 46 is rotated at a rotational speed of 25 revolutions per minute, and the dresser 54 is rotated at a rotational speed of 10 revolutions per minute. The dresser 54 is pressed against the polishing table 46 under a pressing force of 40 N. The fixed abrasive 46a mounted on the polishing table 46 is dressed for 17 seconds, for example. At this time, the atomizer 52 ejects a liquid composed of a mixture of deionized water (DIW) having a flow rate of 1000 cm$^3$/min and nitrogen gas having a pressure of 0.15 MPa onto the fixed abrasive 46a. Thus, a dressing process is performed on the fixed abrasive 46a while atomized liquid is being ejected onto the fixed abrasive 46a. Even if massive particles, which cause scratches on a surface of the wafer, are produced on a surface of the fixed abrasive 46a by performing the dressing process, the atomized liquid which is ejected onto the fixed abrasive 46a can remove the massive particles from the surface of the fixed abrasive 46a to prevent the wafer from being scratched. The atomized liquid may be ejected after the dressing process.

If pressure of the nitrogen gas is higher than 0.5 MPa, then a polishing rate is lowered. Therefore, it is desirable that a flow rate of DIW is within a range of from 200 to 5000 cm$^3$/min, and pressure of the nitrogen gas is within a range of from 0.05 to 0.5 MPa. More preferably, the flow rate of DIW is about 1000 cm$^3$/min and the pressure of the nitrogen gas is about 0.15 MPa. Further, when the ejection nozzles of the atomizer 52 are directed toward outer peripheral edges of the fixed abrasive 46a, the aforementioned massive particles can efficiently be removed from the surface of the fixed abrasive 46a.

2) Polishing Process

The polishing table 46 is rotated at a rotational speed of 10 revolutions per minute, and the top ring 44 is rotated at a rotational speed of 16 revolutions per minute. A wafer is pressed against the polishing table 46 under a surface pressure of 35 kPa. The wafer is polished for 120 seconds, for example. At this time, the polishing liquid supply nozzle 50 supplies a polishing liquid and DIW or a chemical liquid (surface-active agent) onto the fixed abrasive 46a at a flow rate of 200 cm$^3$/min. Although surface pressure of the wafer is 35 kPa in this example, it should preferably be 35 kPa or less in order to prevent scratches of the wafer. Rotational speeds of the polishing table 46 and the top ring 44 during the polishing process may be higher than the above rotational speeds, respectively. For example, the polishing table 46 is rotated at a rotational speed of 60 revolutions per minute, and the top ring 44 is rotated at a rotational speed of 61 revolutions per minute. In this case, a polishing rate is lowered, but the wafer is prevented from being scratched. The polishing process may be performed while the atomized liquid is being ejected onto the fixed abrasive 46a. In this case, the atomized liquid which is ejected onto the fixed abrasive 46a can remove massive particles produced by sliding friction between the wafer and the fixed abrasive 46a.

3) Water-polishing Process

After the polishing process, the polishing table 46 is rotated at a rotational speed of 50 revolutions per minute, and the top ring 44 is rotated at a rotational speed of 40 revolutions per minute. The wafer is pressed against the polishing table 46 under a surface pressure of 10 kPa. The wafer is water-polished for 10 seconds, for example. At this time, the polishing liquid supply nozzle 50 supplies a polishing liquid or DIW onto the fixed abrasive 46a at a flow rate of 1000 cm$^3$/min.

In the water-polishing process, the rotational speed of the polishing table 46 (50 revolutions per minute) is larger than that during the polishing process (10 revolutions per minute). Thus, a relative rotational speed between the polishing surface and the semiconductor wafer is increased to enhance an effect of cleaning and removing abrasive particles attached to the surface of the semiconductor wafer. Further, surface pressure of the wafer (10 kPa) is lower than that during the polishing process (35 kPa), so that the wafer is prevented from being further polished during the water-polishing process. Additionally, the amount of liquid supplied to the fixed abrasive 46a is larger than that during the polishing process, and surface pressure of the wafer is lower than that during the polishing process. As a result, a liquid film between the semiconductor wafer and the polishing surface is thickened, and surface tension therebetween is reduced. Therefore, the semiconductor wafer can easily be separated or removed from the surface of polishing table 46.

4) Overhanging Process

After the water-polishing process, the polishing table 46 is rotated at a rotational speed of 5 revolutions per minute, and the top ring 44 is rotated at a rotational speed of 10 revolutions per minute. The top ring 44 is moved horizontally along the surface of the polishing table 46 by performing a swinging motion of the top ring head 72. Surface pressure of the wafer at this time is adjusted to be lower than 10 kPa. The polishing liquid supply nozzle 50 supplies a polishing liquid or DIW onto the fixed abrasive 46a at a flow rate of 1000 cm$^3$/min. Then, the top ring head 72 is stopped at an overhanging position where a portion of the wafer is exposed beyond an outer peripheral edge of the polishing table 46. The top ring 44 is lifted at the overhanging position to separate or remove the wafer from the surface of the fixed abrasive 46a. This overhanging action allows surface tension of liquid which is produced between the wafer and the polishing table to be reduced. Thus, it is possible to eliminate an undesired force between the wafer and the polishing table and to reliably separate or remove the wafer from the polishing table. Therefore, the wafer can accurately be transferred to a subsequent process. During the overhanging process, rotational speed of the polishing table 46 is lowered from 10 revolutions per minute to 5 revolutions per minute, so that the semiconductor wafer can stably be separated or removed from the polishing table 46 without scratches or unevenly polished portions. The top ring 44 may be lifted at a polishing position, and the semiconductor wafer may be removed from the surface of the fixed abrasive 46a without the above overhanging action. In such a case, when the fixed abrasive 46a has a plurality of grooves formed in the surface thereof, the wafer can easily be removed from the surface of the fixed abrasive 46a.

As described above, the above ex-situ dressing process is performed in a case of polishing a wafer which is likely to be carved and is polished at a high polishing rate. On the other hand, in a case of polishing a semiconductor wafer which has a pattern of ILD, is unlikely to be carved, and is polished at a low polishing rate, the following dressing process (in-situ dressing process) is performed. The same or like processes as in the aforementioned example will not be described below repetitively.

1) In-situ Dressing and Polishing Process

The polishing table 46 is rotated at a rotational speed of 10 revolutions per minute, the dresser 54 is rotated at a rotational speed of 10 revolutions per minute, and the top ring 44 is rotated at a rotational speed of 26 revolutions per minute. A wafer is pressed against the polishing table 46 under a surface pressure of 50 kPa. The wafer is polished for 60 seconds, for example. At this time, the polishing liquid supply nozzle 50 supplies a polishing liquid and DIW or a chemical liquid (surface-active agent) onto the fixed abrasive 46a at a flow rate of 200 cm$^3$/min, and the atomizer 52 ejects a liquid composed of a mixture of DIW having a flow rate of 1000 cm$^3$/min and nitrogen gas having a pressure of 0.15 MPa onto the fixed abrasive 46a. Thereafter, a dressing process of the dresser 54 is stopped. Rotational speed of the top ring 44 is lowered to 16 revolutions per minute, and surface pressure of the wafer is lowered to 35 kPa. A polishing process of the semiconductor wafer is continued for 120 seconds, for example. Specifically, the semiconductor wafer is polished while performing the dressing process (in-situ dressing process) until immediately before convexes formed on a surface of the wafer are planarized, i.e., until remaining steps on the wafer become 100 to 300 Å. Thereafter, the polishing process is continued while stopping the dressing process until the convexes are planarized. Even if massive particles are produced on the surface of the fixed abrasive 46a by the dressing process of the dresser 54 and scratch the surface of the semiconductor wafer, the scratches can gradually be shallowed by continuously polishing the wafer and can finally be eliminated. Although surface pressure of the wafer is lowered to 35 kPa in this example, it should preferably be lowered to 35 kPa or less in order to prevent scratches of the wafer. The polishing process may continuously be performed after the dressing process is stopped while the atomized liquid is being ejected onto the fixed abrasive 46a. In this case, the atomized liquid which is ejected onto the fixed abrasive 46a can remove massive particles produced by sliding friction between the wafer and the fixed abrasive 46a.

2) Water-polishing Process

After the polishing process, the polishing table 46 is rotated at a rotational speed of 50 revolutions per minute, and the top ring 44 is rotated at a rotational speed of 40 revolutions per minute. The wafer is pressed against the polishing table 46 under a surface pressure of 10 kPa. The wafer is water-polished for preferably not less than 5 seconds, for example, 10 seconds. At this time, the polishing liquid supply nozzle 50 supplies a polishing liquid or DIW onto the fixed abrasive 46a at a flow rate of 1000 cm$^3$/min.

3) Overhanging Process

After the water-polishing process, the polishing table 46 is rotated at a rotational speed of 5 revolutions per minute, and the top ring 44 is rotated at a rotational speed of 10 revolutions per minute. The top ring 44 is moved horizontally along the surface of the polishing table 46 by performing a swinging motion of the top ring head 72. Surface pressure of the wafer at this time is adjusted to be lower than 10 kPa. The polishing liquid supply nozzle 50 supplies a polishing liquid or DIW onto the fixed abrasive 46a at a flow rate of 1000 cm$^3$/min. Then, the top ring head 72 is stopped at an overhanging position where a portion of the wafer is exposed beyond an outer peripheral edge of the polishing table 46. The top ring 44 is lifted at the overhanging position to separate or remove the wafer from the surface of the fixed abrasive 46a. The top ring 44 may be lifted at a polishing position, and the semiconductor wafer may be removed from the surface of the fixed abrasive 46a without the overhanging action. In such a case, when the fixed abrasive 46a has a plurality of grooves formed in the surface thereof, the wafer can easily be removed from the surface of the fixed abrasive 46a.

Next, a polishing process for polishing a semiconductor wafer on which a pattern of shallow trench isolations (STI)

is formed will be described below. As with ILD, the following ex-situ dressing process is performed in a case of polishing a wafer which is likely to be carved and is polished at a high polishing rate.

1) Ex-Situ Dressing Process

The polishing table 46 is rotated at a rotational speed of 25 revolutions per minute, and the dresser 54 is rotated at a rotational speed of 10 revolutions per minute. The dresser 54 is pressed against the polishing table 46 under a pressing force of 40 N. The fixed abrasive 46a mounted on the polishing table 46 is dressed for 17 seconds, for example. At this time, the atomizer 52 ejects a liquid composed of a mixture of DIW having a flow rate of 1000 cm$^3$/min and nitrogen gas having a pressure of 0.15 MPa onto the fixed abrasive 46a.

2) Polishing Process

The polishing table 46 is rotated at a rotational speed of 10 revolutions per minute, and the top ring 44 is rotated at a rotational speed of 16 revolutions per minute. The wafer is pressed against the polishing table 46 under a surface pressure of 35 kPa. The wafer is polished for 120 seconds, for example. At this time, the polishing liquid supply nozzle 50 supplies a polishing liquid and DIW or a chemical liquid (anionic surface-active agent) onto the fixed abrasive 46a at a flow rate of 200 cm$^3$/min. Although surface pressure of the wafer is 35 kPa in this example, it should preferably be 35 kPa or less in order to prevent scratches of the wafer. Rotational speeds of the polishing table 46 and the top ring 44 during a polishing process may be higher than the above rotational speeds, respectively. For example, the polishing table 46 is rotated at a rotational speed of 60 revolutions per minute, and the top ring 44 is rotated at a rotational speed of 61 revolutions per minute. In this case, a polishing rate is lowered, but the wafer is prevented from being scratched. The polishing process may be performed while the atomized liquid is being ejected onto the fixed abrasive 46a. In this case, the atomized liquid which is ejected onto the fixed abrasive 46a can remove massive particles produced by sliding friction between the wafer and the fixed abrasive 46a.

During a polishing process of an STI wafer, when an anionic surface-active agent is supplied as a polishing liquid, polishing of a nitride film is prevented, so that the nitride film serves as a stopper for enhancing uniformity within the wafer. In this case, the same kind of chemical liquid as the polishing liquid (e.g., anionic surface-active agent) should preferably be added to liquid used for the atomizer during the polishing process. If concentration of the surface-active agent in the liquid on the polishing surface is reduced by the atomizer, then the nitride film is polished. Therefore, it is important not to change concentration of a liquid which is brought into contact with the wafer during the polishing process.

When the STI wafer is polished, two types of films, i.e., an oxide film and a nitride film, are exposed on the same surface of the wafer. A conventional polishing method using an elastic soft pad has a problem of dishing of the oxide film at trenches. The present invention, with a hard fixed abrasive, is particularly effective in planarization of STI wafers in which different kinds of materials are exposed.

3) Water-polishing Process

After the polishing process, the polishing table 46 is rotated at a rotational speed of 50 revolutions per minute, and the top ring 44 is rotated at a rotational speed of 40 revolutions per minute. The wafer is pressed against the polishing table 46 under a surface pressure of 10 kPa. The wafer is water-polished for preferably not less than 5 seconds, for example, 10 seconds. At this time, the polishing liquid supply nozzle 50 supplies a polishing liquid or DIW onto the fixed abrasive 46a at a flow rate of 1000 cm$^3$/min.

4) Overhanging Process

After the water-polishing process, the polishing table 46 is rotated at a rotational speed of 5 revolutions per minute, and the top ring 44 is rotated at a rotational speed of 10 revolutions per minute. The top ring 44 is moved horizontally along the surface of the polishing table 46 by performing a swinging motion of the top ring head 72. Surface pressure of the wafer at this time is adjusted to be lower than 10 kPa. The polishing liquid supply nozzle 50 supplies a polishing liquid or DIW onto the fixed abrasive 46a at a flow rate of 1000 cm$^3$/min. Then, the top ring head 72 is stopped at a overhanging position where a portion of the wafer is exposed beyond an outer peripheral edge of the polishing table 46. The top ring 44 is lifted at the overhanging position to separate or remove the wafer from the surface of the fixed abrasive 46a. The top ring 44 may be lifted at a polishing position, and the semiconductor wafer may be removed from the surface of the fixed abrasive 46a without the overhanging action. In such a case, when the fixed abrasive 46a has a plurality of grooves formed in the surface thereof, the wafer can easily be removed from the surface of the fixed abrasive 46a.

As described above, the above ex-situ dressing process is performed in a case of polishing a wafer which is likely to be carved and is polished at a high polishing rate. On the other hand, in a case of polishing a semiconductor wafer which has a pattern of STI, is unlikely to be carved, and is polished at a low polishing rate, the following in-situ dressing process is performed, as with ILD.

1) In-situ Dressing and Polishing Process

The polishing table 46 is rotated at a rotational speed of 10 revolutions per minute, the dresser 54 is rotated at a rotational speed of 10 revolutions per minute, and the top ring 44 is rotated at a rotational speed of 26 revolutions per minute. The wafer is pressed against the polishing table 46 under a surface pressure of 50 kPa. The wafer is polished for 60 seconds, for example. At this time, the polishing liquid supply nozzle 50 supplies a polishing liquid and DIW or a chemical liquid (anionic surface-active agent) onto the fixed abrasive 46a at a flow rate of 200 cm$^3$/min, and the atomizer 52 ejects a liquid composed of a mixture of DIW having a flow rate of 1000 cm$^3$/min and nitrogen gas having a pressure of 0.15 MPa onto the fixed abrasive 46a. Thereafter, a dressing process of the dresser 54 is stopped. Rotational speed of the top ring 44 is lowered to 16 revolutions per minute, and the surface pressure of the wafer is lowered to 35 kPa. A polishing process of the semiconductor wafer is continued for 120 seconds, for example. Specifically, the semiconductor wafer is polished while performing the dressing process (in-situ dressing process) until immediately before a surface of the semiconductor wafer is planarized so that a nitride film is exposed, i.e., until a thickness of a remaining oxide film on the nitride film becomes about 500 Å. Thereafter, the polishing process is continued while stopping the dressing process until the nitride film is exposed. Even if massive particles are produced on the surface of the fixed abrasive 46a by the dressing process of the dresser 54 and scratch the surface of the semiconductor wafer, the scratches can gradually be shallowed by continuously polishing the wafer and can finally be eliminated. Although surface pressure of the wafer is lowered to 35 kPa in this example, it should preferably be lowered to 35 kPa or less in order to prevent scratches of the wafer.

2) Water-polishing Process

After the polishing process, the polishing table 46 is rotated at a rotational speed of 50 revolutions per minute, and the top ring 44 is rotated at a rotational speed of 40 revolutions per minute. The wafer is pressed against the polishing table 46 under a surface pressure of 10 kPa. The wafer is water-polished for preferably not less than 5 seconds, for example, 10 seconds. At this time, the polishing liquid supply nozzle 50 supplies a polishing liquid or DIW onto the fixed abrasive 46a at a flow rate of 1000 cm$^3$/min.

3) Overhanging Process

After the water-polishing process, the polishing table 46 is rotated at a rotational speed of 5 revolutions per minute, and the top ring 44 is rotated at a rotational speed of 10 revolutions per minute. The top ring 44 is moved horizontally along the surface of the polishing table 46 by performing a swinging motion of the top ring head 72. Surface pressure of the wafer at this time is adjusted to be lower than 10 kPa. The polishing liquid supply nozzle 50 supplies a polishing liquid or DIW onto the fixed abrasive 46a at a flow rate of 1000 cm$^3$/min. Then, the top ring head 72 is stopped at an overhanging position where a portion of the wafer is exposed beyond an outer peripheral edge of the polishing table 46. The top ring 44 is lifted at the overhanging position to separate or remove the wafer from the surface of the fixed abrasive 46a. The top ring 44 may be lifted at a polishing position, and the semiconductor wafer may be removed from the surface of the fixed abrasive 46a without the overhanging action. In such a case, when the fixed abrasive 46a has a plurality of grooves formed in the surface thereof, the wafer can easily be removed from the surface of the fixed abrasive 46a.

The semiconductor wafer thus polished with the fixed abrasive 46a is transferred to the small-diameter polishing table 48, in which a buff cleaning process is performed. Specifically, while the top ring 44 and the polishing table 48 are respectively rotated independently of each other, the polished semiconductor wafer held by the top ring 44 is pressed against the soft nonwoven fabric on the polishing table 48. At this time, a liquid containing no abrasive particles, such as pure water or alkali liquid, is supplied onto the nonwoven fabric from a cleaning liquid supply nozzle (not shown). The alkali liquid should preferably comprise an alkali liquid having a pH of 9 or larger, or an alkali liquid containing TMAH. With this buff cleaning process, abrasive particles attached to a surface of the polished semiconductor wafer can effectively be removed from the surface of the wafer.

Instead of the above buff cleaning process, a DHF cleaning process of the semiconductor wafer may be performed in the cleaning unit 23 or 25. In this case, DHF supply nozzles 114a, 114b eject a DHF liquid of 0.5% toward the wafer for about 30 seconds, for example (see FIG. 3). With the DHF cleaning process, an oxide film on the surface of the polished semiconductor wafer is dissolved and removed by the DHF liquid, and abrasive particles which have been attached to the surface of the oxide film are simultaneously removed. In this case, it is desirable to use a DHF liquid having a concentration of 0.1% or higher. When the wafer is scrubbed with the PVA sponges 112a, 112b, as shown in FIG. 3, the abrasive particles can be removed more effectively. Ozone water or electrolytic ion water may be used instead of a DHF liquid. After the buff cleaning process or the DHF cleaning process, the surface of the semiconductor wafer may be cleaned with a pencil-type sponge or the like. Particularly, when abrasive particles used in the fixed abrasive comprise cerium oxide, abrasive particles of cerium oxide are likely to be attached to the surface of the wafer. Therefore, the buff cleaning process or the DHF cleaning process can achieve a clean wafer after the polishing process.

After the polishing process with the fixed abrasive 46a, a final polishing process may be performed on the semiconductor wafer. This final polishing process may be performed using either of the polishing table 46 and the polishing table 48. In either case, the final polishing process is performed with use of a polishing liquid containing abrasive particles, and a water-polishing process and cleaning process (buff cleaning process or DHF cleaning process) are performed after the final polishing process.

In the present embodiment, the large-diameter polishing table 46 has the fixed abrasive thereon, and the small-diameter polishing table 48 has the polishing pad (nonwoven fabric) thereon. A wafer is polished with the large-diameter polishing table 46 and then polished with the small-diameter polishing table 48. Thus, a two-stage polishing process is performed in the present embodiment. However, the present invention is not limited to such a two-stage polishing process.

Generally, in a case of a polishing table having a small diameter which provides a small relative speed between a polishing surface and a semiconductor wafer, a sufficient polishing rate cannot be achieved. Therefore, when it is necessary to maintain a polishing rate of a certain level, a primary polishing process is generally performed with a polishing table having a large diameter which can provide a large relative speed between a polishing surface and the semiconductor wafer. However, when the aforementioned fixed abrasive is used during the polishing process, a polishing rate of a certain level can be maintained even if a relative speed between the polishing surface and the semiconductor wafer is small. Therefore, a primary polishing process can be performed with the small-diameter polishing table 48. From this point of view, the small-diameter polishing table 48 may have a fixed abrasive and the large-diameter polishing table 46 may have a polishing pad (polishing cloth), for example. In this case, a semiconductor wafer may be polished with the small-diameter polishing table 48 and then polished with the large-diameter polishing table 46.

A fixed abrasive is more expensive than a polishing pad, and a price thereof becomes higher in proportion to a diameter thereof. The lifetime of a polishing pad is shorter than that of a fixed abrasive. Therefore, when a polishing pad is applied to a large-diameter polishing table which can disperse frequency of contact with a wafer to prolong the lifetime of the polishing pad, frequency of maintenance is lengthened to improve productivity. As described above, a fixed abrasive which is more expensive than a polishing pad and is difficult to be formed is used for the small-diameter polishing table 48, and a polishing pad of which the lifetime is shorter than that of a fixed abrasive is used for the large-diameter polishing table 46. A wafer is roughly polished with the small-diameter polishing table 48 and then finally polished with the large-diameter polishing table 46.

With this process, running-cost can be reduced, and it is easy to perform maintenance of the polishing apparatus.

From a viewpoint of planarization and cost savings, a polishing tool used for the small-diameter polishing table 48 may comprise any polishing tool other than the fixed abrasive. For example, a hard pad which is not a fixed abrasive may be used for the small-diameter polishing table 48, and a wafer may be polished while supplying a chemical liquid having an etching effect or the like, such as an oxidizing agent for polishing a Cu film, an etching agent, or an oxidation inhibitor. Particularly, when a chemical liquid such as an etching agent is supplied for a metallic film formed on a semiconductor wafer, the chemical liquid degrades a surface of the metallic film. Therefore, a removal process of a surface of the semiconductor wafer can be performed without abrasive particles by mechanical effects of sliding contact between the hard pad and the semiconductor wafer. Although the chemical liquid should preferably contain no abrasive particles, it may contain abrasive particles. Further, pure water containing abrasive particles may be used as the chemical liquid. In these cases, it is possible to achieve a high level of planarization and a high polishing rate as with a fixed abrasive.

When a hard pad is used for polishing a wafer, fine scratches are likely to be produced on a surface of the wafer, and hence it is necessary to perform a final polishing process thereafter. Further, when the wafer is planarized, a polishing rate is considerably lowered. Therefore, it takes much time to further polish the wafer to a predetermined film thickness after the wafer is planarized. Consequently, it is desirable that after a polishing process with the small-diameter polishing table 48, a final polishing process is subsequently performed with the larger-diameter polishing table 46. In this case, from a viewpoint of achieving a high polishing rate and removing scratches from the wafer, it is desirable that a soft pad is mounted on the large-diameter polishing table 46, and the final polishing process is performed while supplying slurry to the soft pad.

In some cases, a thickness of a film formed on a surface of a semiconductor wafer is different between a central portion and a peripheral portion of the semiconductor wafer. For example, a film on the surface is thin at a central portion of a semiconductor wafer, gradually becomes thicker toward a peripheral portion of the semiconductor wafer, and becomes thin at an outermost peripheral portion of the semiconductor wafer. In order to planarize such a semiconductor wafer when the semiconductor wafer is polished with a soft polishing pad while supplying slurry thereto, it is necessary to control the top ring so as to follow a varying film profile, which is too complicated to be achieved. When such a semiconductor wafer is polished with a polishing surface of a fixed abrasive or a hard pad that is not a fixed abrasive while supplying a chemical liquid having an etching effect, it is possible to achieve planarization of such a semiconductor wafer. Such a polishing process can be applied to a case where semiconductor chips have differences of densities of patterns and pitches of convexities on surfaces thereof.

In the above embodiment, a polishing tool mounted on the large-diameter polishing table 46 is not limited to the polishing pad, and may comprise a fixed abrasive. In a case where a fixed abrasive is mounted on the large-diameter polishing table 46, a semiconductor wafer is planarized with the small-diameter polishing table 48 and then finally polished with the large-diameter polishing table 46 while supplying pure water or a chemical liquid containing no abrasive particles.

Figure 4:
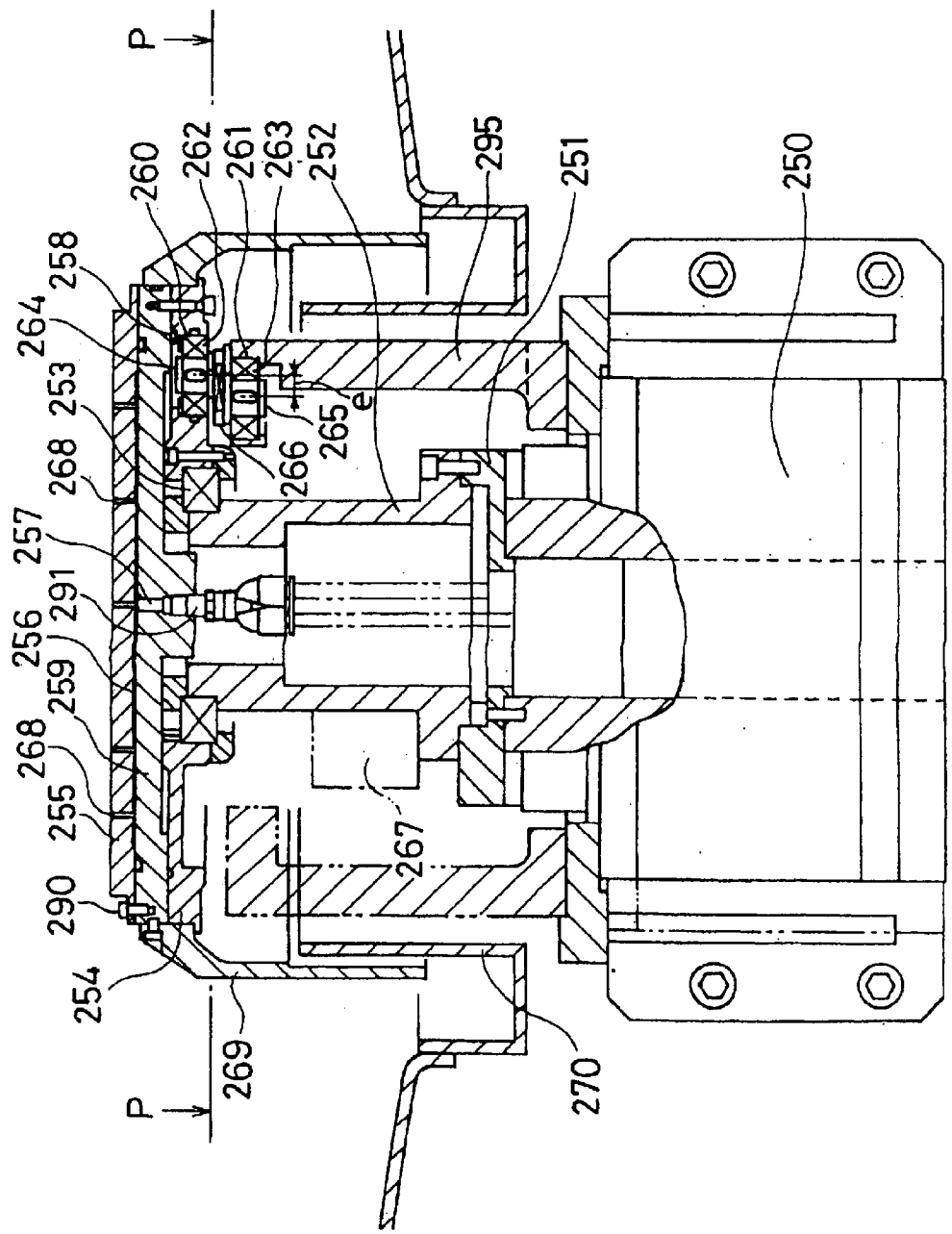
FIG. 4 is a vertical cross-sectional view of a polishing table of a polishing apparatus according to another embodiment of the present invention.
Figure 5A:
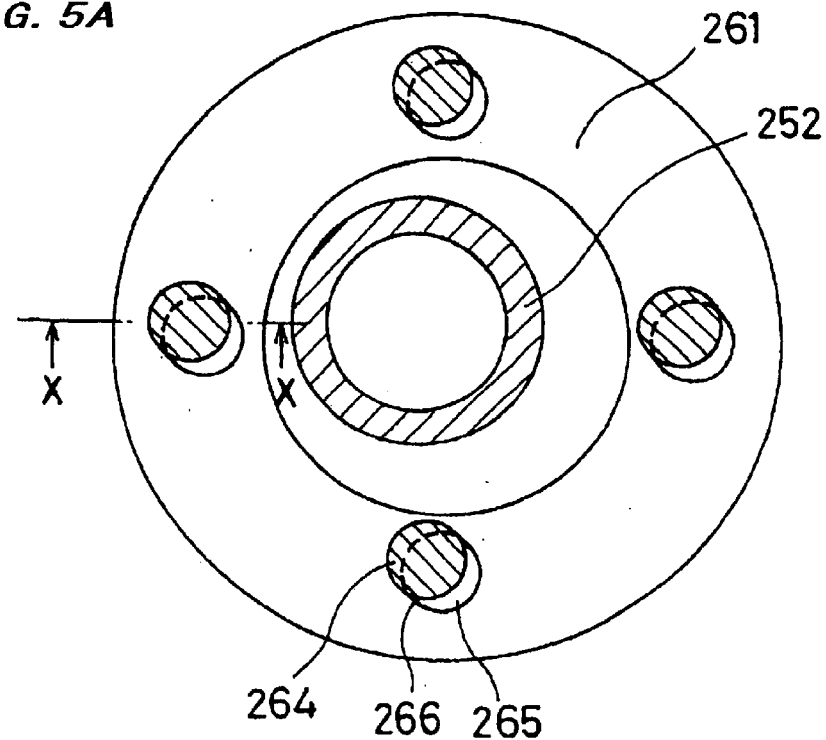
FIG. 5A is a cross-sectional view taken along a line P—P of FIG. 4.
Figure 5B:
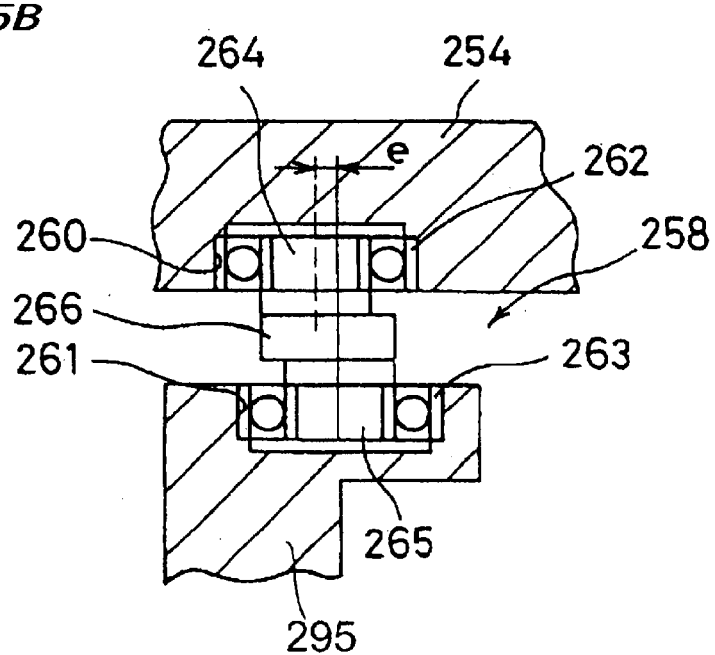
FIG. 5B is a cross-sectional view taken along a line X—X of FIG. 5A.

The polishing tables are not limited to the polishing tables shown in FIG. 2. For example, the polishing tables 46, 47, 48 and 49 may comprise a scroll-type polishing table as shown in FIGS. 4, 5A and 5B. Such a scroll-type polishing table will be described below. FIG. 4 is a vertical cross-sectional view showing a scroll-type polishing table in a polishing apparatus according to another embodiment of the present invention. FIG. 5A is a cross-sectional view taken along a line P—P of FIG. 4, and FIG. 5B is a cross-sectional view taken along a line X—X of FIG. 5A.

As shown in FIGS. 4, 5A and 5B, the scroll-type polishing table has an upper flange 251 of a motor 250, and a hollow shaft 252 connected to the upper flange 251 by bolts. A set ring 254 is supported by an upper portion of the shaft 252 through a bearing 253. A table 259 is fixed to the set ring 254, and polishing table 255 is fixed to the table 259 by bolts 290. The polishing table 255 may comprise a fixed abrasive entirely, or may comprise a plate made of a corrosion-resistant metal such as stainless steel and a polishing pad attached to the plate. When using a fixed abrasive or a polishing pad, the polishing table 255 may have a flat upper surface or a slightly convex or concave upper surface. An outer diameter of the polishing table 255 is set to be equal to or larger than a diameter of a wafer plus a distance "$2e$". Specifically, the diameter of the polishing table 255 is arranged such that when the polishing table 255 makes a translational motion, the wafer does not project from an outer periphery of the polishing table 255.

The set ring 254 has three or more supporting portions 258 in a circumferential direction for supporting the table 259. A plurality of recesses 260, 261 are formed, at positions corresponding to an upper surface of the supporting portions 258, in the set ring 254 and an upper end of a cylindrical member, at angularly equal intervals in a circumferential direction. Bearings 262, 263 are mounted in the recesses 260, 261. As shown in FIGS. 4, 5A and 5B, a support member 266 having two shafts 264, 265 is supported by the bearings 262, 263. Central axes of the shafts 264, 265 are spaced from each other by a distance "$e$". Specifically, the two shafts 264, 265 are inserted into the bearings 262, 263, respectively. Thus, the polishing table 255 makes a translational motion along a circle having a radius "$e$" by driving the motor 250.

Further, a center of the shaft 252 is off-centered by distance "$e$" from a center of the motor 250. A balancer 267 is fixed to the shaft 252 for providing a balance to load caused by eccentricity.

A polishing liquid is supplied onto the polishing table 255 through an interior of the motor 250 and the shaft 252, a through-hole 257 formed in a central portion of the table 259, and a coupling 291. The supplied polishing liquid is once stored in a space 256 formed between the polishing table 255 and the table 259, and then supplied to an upper surface of the polishing table 255 through a plurality of through-holes 268 formed in the polishing table 255 so as to be brought into direct contact with a wafer. The number and positions of the through-holes 268 can be selected depending on the kind of process being performed. In a case where a polishing pad is attached to the polishing table 255, the polishing pad has through-holes at positions corresponding to the positions of the through-holes 268. In a case where the polishing table 255 is made of a fixed abrasive in its entirety, the upper surface of the polishing table 255 may have lattice-like grooves, spiral grooves, or radial grooves so as to communicate with the through-holes 268.

The supplied polishing liquid may be selected from pure water, chemical liquids, or slurry. More than one kind of polishing liquid can be supplied simultaneously, alternatively, or sequentially, as needed.

In order to protect a mechanism for performing a translational motion, from a polishing liquid used for polishing, a flinger or a thrower 269 is attached to the table 255, and forms a labyrinth mechanism together with a trough 270.

With the above structure, when the motor 250 is driven, the polishing table 255 makes a circulatory translational motion (scroll motion) and a semiconductor wafer held by top ring 44 is pressed against a polishing surface of the polishing table 255. The semiconductor wafer is polished by polishing liquid supplied through the through-hole 257, the space 256 and the through-holes 268. The semiconductor wafer is polished by relative circulatory translational motion, having a radius "e", between a polishing surface of the polishing table 255 and the wafer. Thus, the semiconductor wafer is uniformly polished over the entire surface thereof. If a surface, to be polished, of the semiconductor wafer and the polishing surface have the same positional relationship, then a polished semiconductor wafer is affected by a local difference in the polishing surface. In order to eliminate this influence, the top ring 44 is rotated at a low speed to prevent the semiconductor wafer from being polished at the same area on the polishing surface.

In the above embodiments, the dressers 54, 55, 56 and 57 comprise dressers having diamond particles electrodeposited thereon as mechanical dressing tools. However, various dressing tools may be used for promoting self-generation of the abrasive particles from the fixed abrasive to the polishing surface, depending on composition and characteristics of the fixed abrasive. For example, in a case of a fixed abrasive in which abrasive particles are likely to be self-generated, dressing tools may comprise a brush dresser having a nylon brush or the like, an optical dresser for modifying a surface of the fixed abrasive by light emission to promote self-generation of the abrasive particles, an ultrasonic dresser for vibrating a liquid on a polishing surface by ultrasonic vibration to promote self-generation of the abrasive particles, or a chemical liquid dresser for dissolving or modifying binder of the fixed abrasive by a chemical liquid to promote self-generation of the abrasive particles.

Although certain preferred embodiments of the present invention have been shown and described in detail, it should be understood that various changes and modifications may be made therein without departing from the scope of the appended claims.

What is claimed is:

1. A method comprising:

holding a workpiece by a top ring;

polishing said workpiece by bringing said workpiece held by said top ring into sliding contact with a fixed abrasive that includes cerium oxide abrasive particles and a binder;

removing said workpiece held by said top ring from said fixed abrasive;

transferring said workpiece held by said lop ring to a buffing table having a buffing surface; and then buffing said workpiece held by said top ring by pressing said workpiece against said buffing surface and supplying an alkali liquid containing TMAH and no abrasive particles to said buffing surface, wherein polishing said workpiece by bringing said workpiece into sliding contact with a fixed abrasive comprises (i) using said top ring to press said workpiece against said fixed abrasive under a first pressing force while moving said workpiece relative to said fixed abrasive at a first speed, and then (ii) using said top ring to press said workpiece against said fixed abrasive under a second pressing force, which is less than said first pressing force, while supplying a polishing liquid to said fixed abrasive and moving said workpiece relative to said fixed abrasive at a second speed which is greater than said first speed.

2. The method according to claim 1, wherein said buffing surface is larger than said workpiece.

3. The method according to claim 1, wherein said alkali liquid has a pH of at least 9.

4. The method according to claim 3, wherein said buffing surface is larger than said workpiece.

5. The method according to claim 1, wherein said buffing table is disposed around said fixed abrasive.

6. The method according to claim 1, wherein said buffing table comprises a circular disc table.

7. The method according to claim 1, wherein using said top ring to press said workpiece against said fixed abrasive while supplying a polishing liquid to said fixed abrasive comprises using said top ring to press said workpiece against said fixed abrasive while supplying water to said fixed abrasive.

* * * * *

UNITED STATES PATENT AND TRADEMARK OFFICE
CERTIFICATE OF CORRECTION

PATENT NO. : 6,827,633, B2 Page 1 of 1
DATED : December 7, 2004
INVENTOR(S) : Yutaka Wada et al.

It is certified that error appears in the above-identified patent and that said Letters Patent is hereby corrected as shown below:

Column 22,
Line 10, change "lop" to -- top --.

Signed and Sealed this

Nineteenth Day of April, 2005

JON W. DUDAS
*Director of the United States Patent and Trademark Office*